United States Patent [19]

Horbruegger et al.

[11] Patent Number: 5,155,305
[45] Date of Patent: Oct. 13, 1992

[54] DELAYED START OF ELEVATOR CAR DECELERATION AND CREEP USING VVVF TECHNOLOGY

[75] Inventors: Herbert K. Horbruegger; Jost-Ingo Eichberger, both of Berlin, Fed. Rep. of Germany

[73] Assignee: Otis Elevator Company, Farmington, Conn.

[21] Appl. No.: 596,456

[22] Filed: Oct. 12, 1990

[30] Foreign Application Priority Data

Oct. 16, 1989 [EP] European Pat. Off. ........ 89119192.6

[51] Int. Cl.$^5$ .............................................. B66B 1/30
[52] U.S. Cl. .................................................. 187/119
[58] Field of Search ............... 187/119, 111, 116, 108; 318/802

[56] References Cited

U.S. PATENT DOCUMENTS

| | | | |
|---|---|---|---|
| 3,785,463 | 1/1974 | Kuhl et al. | 187/118 |
| 3,902,575 | 9/1975 | Ostrander | 187/116 |
| 4,155,426 | 5/1979 | Booker | 187/127 |
| 4,394,889 | 7/1984 | Gray | 187/108 |
| 4,470,482 | 9/1984 | Husson | 187/118 |
| 4,680,526 | 7/1987 | Okuyama et al. | 318/802 |
| 4,681,191 | 7/1987 | Ikejima | 187/119 |
| 4,700,811 | 10/1987 | Evin | 187/116 |
| 4,713,595 | 12/1987 | Yonemoto | 187/119 |
| 4,773,508 | 9/1988 | Mine et al. | 187/119 |
| 4,982,816 | 1/1991 | Doi et al. | 187/119 |
| 4,991,693 | 2/1991 | Stern et al. | 187/111 |

Primary Examiner—A. D. Pellinen
Assistant Examiner—Lawrence E. Colbert
Attorney, Agent, or Firm—Francis J. Maguire, Jr.

[57] ABSTRACT

The invention concerns an open-look speed control device for an induction motor to drive an elevator cabin, approaching a premarked where braking must be initiated point in advance of stopping at a marked point at a floor level to be approached at a creep speed, and for a VVVF inverter, which supplies current to the induction motor.

The current supplied to the induction motor, is measured when the cabin travels at constant speed prior to reaching the premarked point.

A slippage compensation unit determines a pertinent slippage frequency from the measured active current, and from it derives the frequency specification for the upcoming creep phase. A memory stores a function that indicates creep time as a function of the measured active current.

A computer unit calculates a delay time for the next run from the measured creep time. The start of the cabin's deceleration process is delayed, according to a lookup function, and after the car stops a new virtual updated creep time is again "measured" by turning from the stopping of dictated deceleration until the actual end of the creep process.

2 Claims, 4 Drawing Sheets

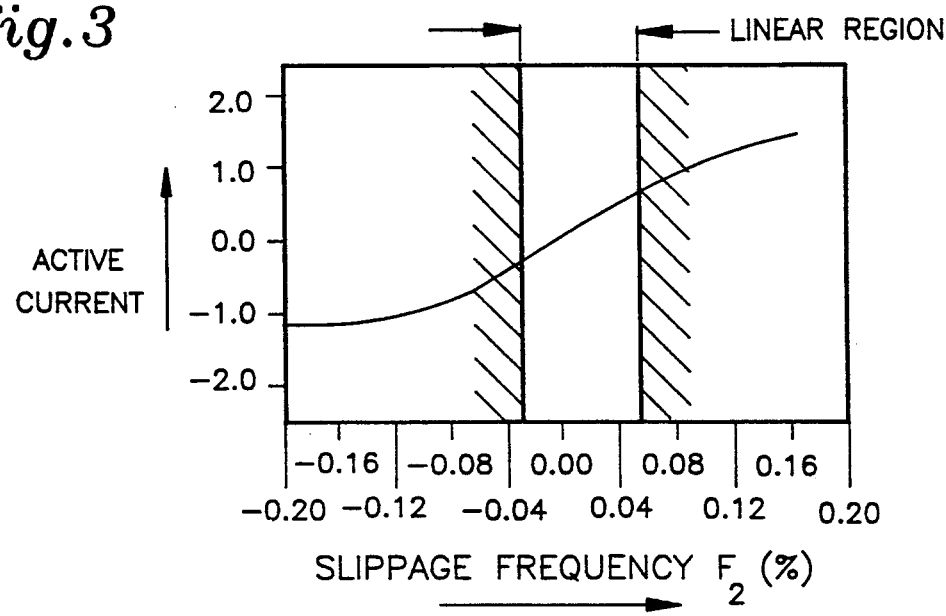
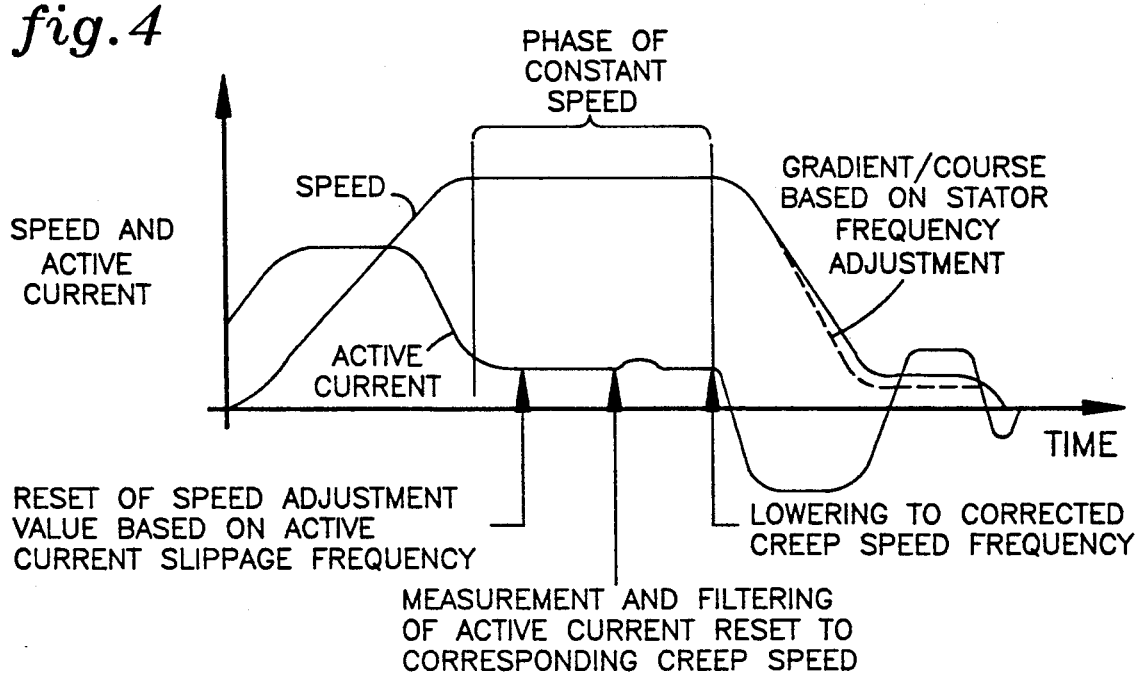

5,155,305

DELAYED START OF ELEVATOR CAR DECELERATION AND CREEP USING VVVF TECHNOLOGY

TECHNICAL FIELD

The invention concerns an open-loop speed control device for an elevator, and more particularly, with improving stop position accuracy.

BACKGROUND OF THE INVENTION

A variable voltage, variable frequency (VVVF) inverter rectifier driving an induction motor can be used to improve the travel comfort in one or two-speed elevator installations, offering a very cost-effective solution because of the low mechanical expense, since no speed sensors are required, which usually are installed to provide accuracy in approaching the floor level.

Such a control device for an elevator is described in U.S. Pat. No. 4,680,526, for example. In that control device, an inverter drives an induction motor. The primary current flowing into the induction motor is measured. Torque and slippage are determined on the basis of this primary current. In turn, output voltage and inverter frequency are controlled as a function of the slippage determined in this manner. In addition, the r.p.m. of the induction motor is estimated as a function of the determined torque current, and the induction motor's r.p.m. is controlled, so that the estimated r.p.m. signal corresponds to the nominal r.p.m.

The cost of such a control device is considerable. Furthermore, positioning contacts must be installed to provide accuracy when the elevator cabin approaches a floor level.

The invention is predicated on analysis of operation of induction motors and elevators driven thereby. For travel comfort, it is not always necessary to regulate the cabin speed in a closed loop so long as motor current is controlled so that the motor can produce the desired torque at any stator frequency. In this way, a ratio for torque and slippage is obtained, which can be approximately linear within a certain range. An example is shown in FIG. 1, where the slippage frequency is the abscissa and the electric torque is the ordinate.

The acceleration and braking requirements can be fulfilled with a suitable reference frequency profile. However, the elevator cabin speed depends on the load condition, because of the dependence of torque and slippage on the motor. For that reason, a reference profile, which ends in a creep speed section, is necessary for the level approach. FIG. 2 shows such a profile, wherein the abscissa is time and the ordinate is speed. The accuracy of the level approach depends on the creep speed, and a certain minimum travel time is required to ensure sufficient creep distance, even in the worst of cases.

DISCLOSURE OF THE INVENTION

Objects of the invention include provision of an open loop speed control device for an elevator motor where an approach to floor level is as accurate as possible, and the length of travel at the creep speed is also small.

According to the present invention, a VVVF inverter measures the active current supplied to the induction motor while the cabin is travelling at constant speed before reaching the point of deceleration for a stop at a floor, slippage frequency is determined from the measured active current used to derive the creep speed to the next marked point, a creep time measurement is made from the end of the dictated deceleration part of the speed profile until the premarked point is sensed a function indicating the time of travel at the creep speed, which is dependent on the measured active current, is stored in a memory, a delay from the thus measured creep speed normal onset of deceleration to the delay the start of the cabin braking or deceleration process in the next fun; taking the thus computed delay time into account, a new updated virtual creep time function is determined after each run, and the VVVF inverter is controlled by means of a voltage/frequency signal, as a function of the updated virtual creep time.

Thus, the present invention provides a speed sensorless speed control with a quasi-closed loop creep time control which may be thought of as a "slow" loop in the sense that it does not "close" the loop until the next run cycle of the cabin. It will be realized that the start of the measurement of the creep time for each run cycle corresponds to the end of the dictated deceleration phase of the speed profile. This does not necessarily correspond to the true end of such deceleration because the system response does not necessarily exactly follow the command. In that sense also, the "slow" loop creep time control is not an ordinary closed loop which is normally thought of as exactly controlling the difference between a commanded magnitude for a parameter and the measured magnitude thereof in response thereto.

Nevertheless, by changing the timing of the onset of deceleration in dependence on creep time and current measurements during the previous cabin run, the present invention teaches a new way to fine-tune the stopping accuracy of the cabin at the floor level and to improve flight time between floors by keeping creep time small.

BRIEF DESCRIPTION OF THE DRAWING

FIG. 3 is a graph of the dependence of the active current on the slippage frequency;

FIG. 4 is a graph of a speed profile when the elevator cabin is traveling and the corresponding magnitudes of the active current;

BEST MODE FOR CARRYING OUT THE INVENTION

The control device according to the invention measures the active current during constant speed operation, which can be done, for example, by measuring the phase angle and current magnitude in a motor line, or by measuring the intermediate current in the frequency converter. The active current relates to the slippage frequency as shown in FIG. 3, where the abscissa is the slippage frequency and the ordinate is the active current. This dependence can be approximated in the first instance by a linear function within a normal operating range.

This makes it possible to correct the reference magnitude of the creep speed by estimating the slippage frequency derived from the active current measurement. It reduces the speed error during operation the creep speed and thus leads to greater accuracy of the cabin's level approach.

FIG. 4, in which the abscissa is time and the ordinate is the speed and active current for the motor load condition of a full cabin travelling upward, shows this compensation principle in more detail: the active current is relatively high during acceleration and is lower during steady travel, as a function of load and friction. As shown, during the braking process, the direction of the active current can reverse, and then, during the creeping process, nearly resume the steady value of normal speed.

Figure 1:
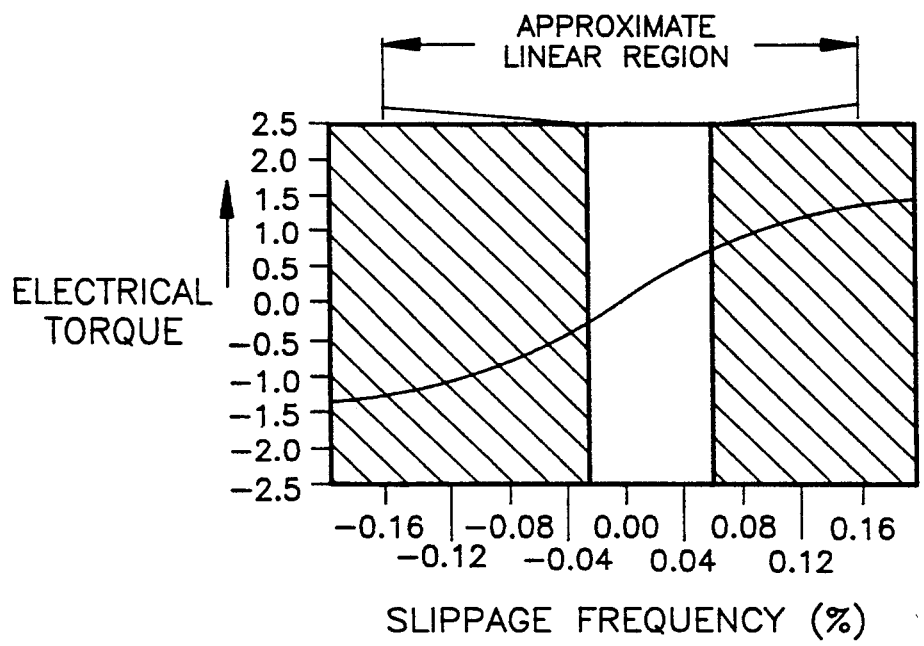
FIG. 1 is a graph of the dependence of the electrical torque on the slippage frequency.
Figure 2:
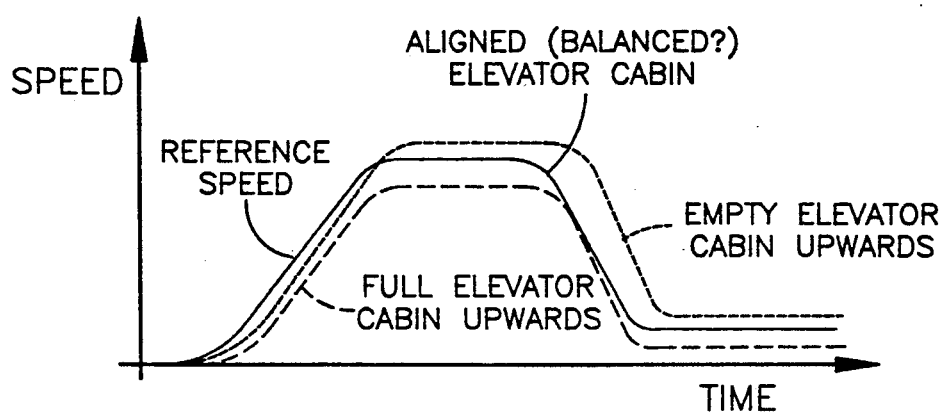
FIG. 2 is a graph of a speed profile with a fixed, unchanged, nominal frequency profile.
Figure 5:
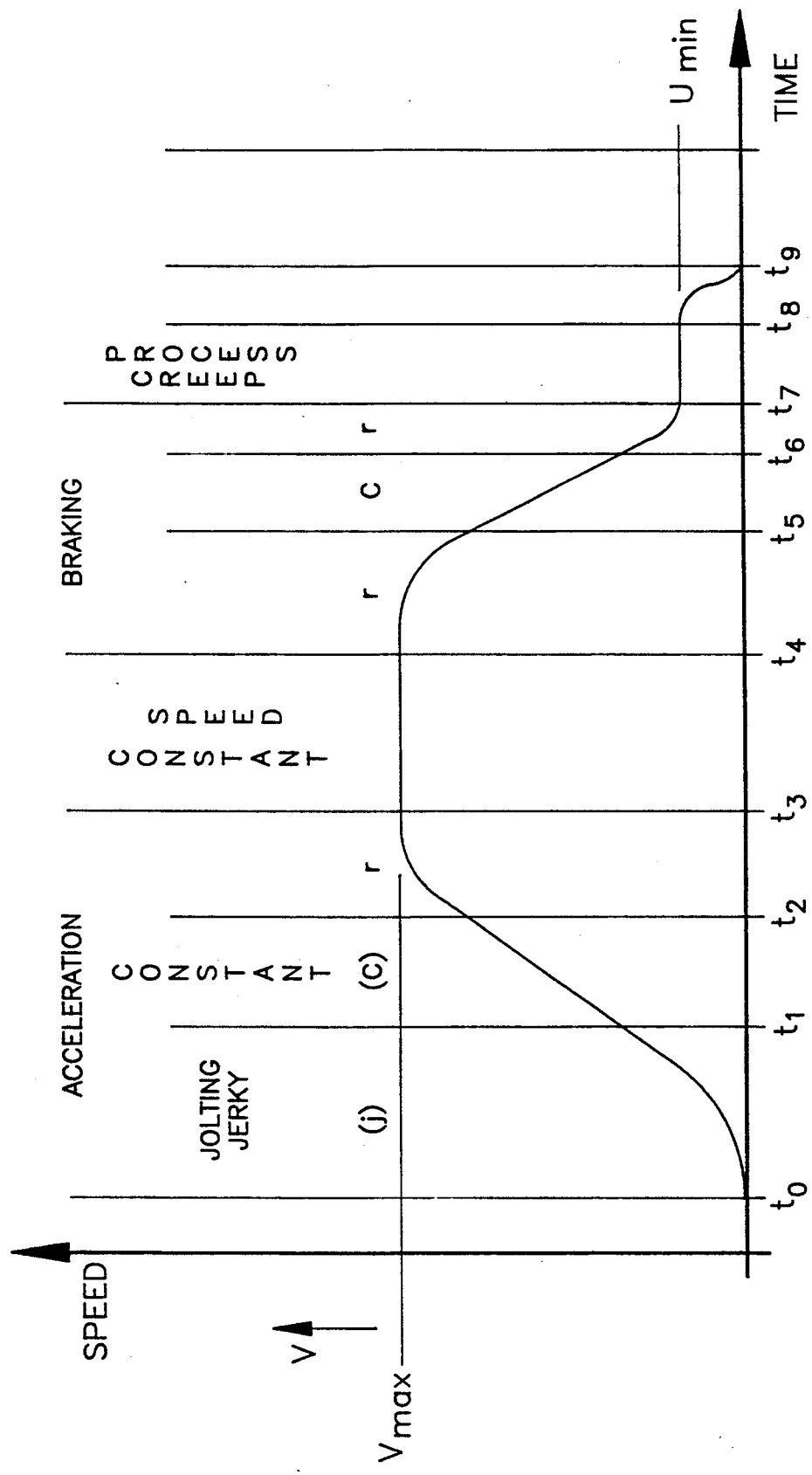
FIG. 5 is a graph of another speed profile.

Creep time is the difference between the end of the braking section, provided by the point in time when the steady nominal frequency profile is reached, and the point at which the cabin passes a level mark at a floor. FIG. 5 shows a cabin speed profile with the creep time between time points t7 and t8. In this FIG. 5, the abscissa is time and the ordinate is the cabin speed.

Figure 6:
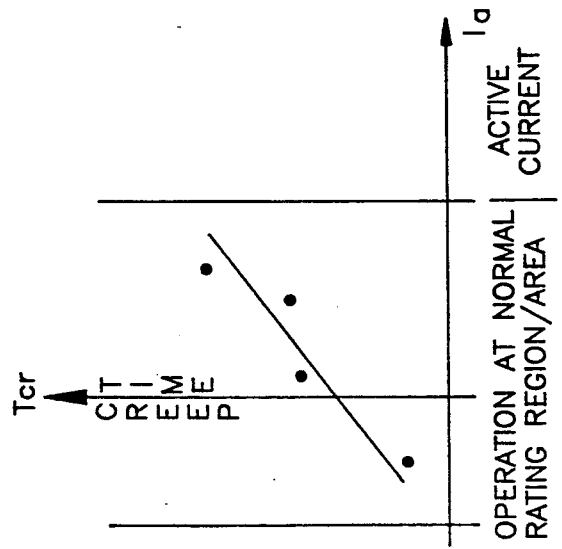
FIG. 6 is a graph of the dependence of the creep time on the active current.

The measured values of the active current, measured at constant speed during operation, and the creep time resulting from the creep speed at the end of the elevator's travel, are stored in memory. After the travel is completed i.e., the car is stopped, the control 12 makes an approximation of the relation between the active current and the measured creep times. This produces a creep time function, Tcv as shown in FIG. 6, wherein the active current is the abscissa and different creep times the ordinate.

This creep time function is used for future travel of the cabin to delay a control signal that initiates the braking or deceleration process. Thus, the timing of the beginning of the deceleration portion of the profile is delayed from a nominal beginning at time t7 (as the cabin passes a sensed premarked point in the hoistway) by a time delay $T_D$. The delay time according to the creep time can therefore be expressed by the following equations:

$$T_D = T_c(V_c/V_n)$$

where
$T_D$ = delay time at the start of the braking process,
$V_c$ = creep speed
$V_n$ = nominal speed, and
$T_c$ = creep time.

Updating of the creep time function provides a (or estimated, next run) creep time Tcv, which encompasses the last stop-delay time Tdl. The following relation applies:

$$Tcv = Tcm + Tdl\,(Vn/Vc)$$

where
Tcv = virtual creep time
Tcm = measured creep time measured in the last run
Tdl = delay time act volly used for the corresponding travel last run.

In this way, the compensation function is completed after each run of the cabin. All parameter changes of the elevator installation, such as for example a change in gear friction or a change in temperature, which affect the relationship between motor torque and slippage, are automatically considered during updating. This function can also be weighted for adaptation to time variable parameters.

Figure 7:
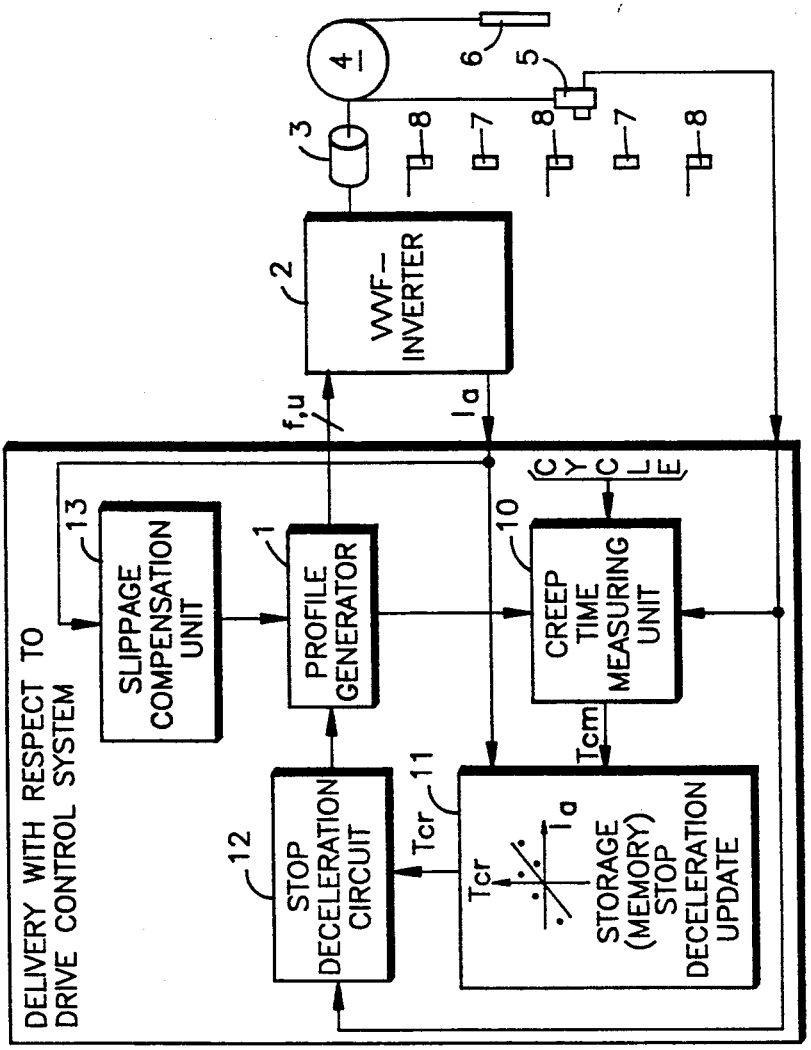
FIG. 7 is a schematic block diagram of an embodiment of the invention.

FIG. 7 is a block diagram representation of an elevator cabin 5, connected by a wire cable to a counterweight 6. The wire cable leads over a roller 4, driven by an induction motor 3. Premarked points 7 indicate when a braking process must be initiated, prior to reaching a marked floor points 8 where the period of constant creep speed is terminated and the car is finally decelerated to a stop.

Induction motor 3 is driven by a VVVF inverter 2. This VVVF inverter measures active current Ia supplied to induction motor 3. The slippage frequency can be derived from this active current Ia, as explained earlier. A slippage compensation unit 13 provides slippage compensation as a function of the thus determined active current Ia.

A creep time measuring unit 10 measures the creep time of cabin 5 and sends a corresponding signal to memory 11. This memory stores paired values of the creep time (Tc) and active current (Ia).

A stop-delay computer 12 provides said delay time in response to sensing the car passing the premarked point (7) which controls the start of the deceleration or braking part of the speed profile by means of a profile generator 1, which in turn sends a corresponding frequency and voltage signal to the VVVF inverter 2, so that the latter can control induction motor 3 as a function of the updated creep time.

We claim:

1. A control device for an elevator installation with
    an induction motor (3) to drive an elevator cabin (5), which approaches a floor level specified by a marked point (8) from a premarked point (7) at a delayed deceleration profile,
    a VVVF inverter (2), which supplies current to the induction motor (3) and measures the active current supplied to the induction motor (3) for providing an active current ($I_a$) signal having a magnitude indicative thereof, when the cabin (5) travels at a constant speed prior to reaching the premarked point (7),
    a slippage compensation unit (13) determines the pertinent slippage frequency from the measured active current signal, and from it derives the creep speed ($V_c$) to the next marked point (8) and provides a creep speed signal having a magnitude indicative thereof,
    means (10) responsive to a signal indicative of the end of said cabin's deceleration and to a signal indicative of the end of said cabin's constant creep speed, for providing a creep time signal ($T_c$) by measuring said period of constant creep speed ($t_7 - t_8$),
    a memory unit (11) for providing a virtual creep time ($T_{cv}$) signal in response to the measured current (Ia) signal and the updated creep time signal ($T_{cm}$) by which the start of cabin's (5) braking process is delayed during each run;
    means (12) responsive to said virtual creep time signal for registering said virtual creep time signal for providing a delay time ($T_D$) signal and responsive to said car passing said premarked point (7) for providing a start deceleration profile signal, and
    a profile generator (1) controls the VVVF inverter (2) with a voltage/frequency signal (f, u) in response to said start deceleration signal for providing a dictated speed profile having a creep speed for a virtual creep time.

2. A control device according to claim 1, defined by the virtual updated delay time is defined by the following equation:

$$T_{cv} = T_{cm} + T_D \cdot \frac{V_n}{V_c}$$

where
$T_{cm}$ = measured creep time,
$T_D$ = delay time,
$V_n$ = nominal cabin speed, and
$V_c$ = cabin creep speed.

* * * * *